United States Patent
Tadauchi et al.

(10) Patent No.: US 6,220,501 B1
(45) Date of Patent: Apr. 24, 2001

(54) METHOD OF JOINING METALLIC MEMBERS, AND JOINED METALLIC MEMBERS

(75) Inventors: Masahiro Tadauchi, Tokyo; Izuru Komatsu, Kanagawa; Kouichi Teshima, Tokyo; Rikiya Katoh, Saitama; Jun Sugimoto, Tokyo; Takayuki Suzuki; Mitsuyoshi Hirayama, both of Saitama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/169,981

(22) Filed: Oct. 13, 1998

(30) Foreign Application Priority Data

Oct. 13, 1997 (JP) .................................................. 9-279205

(51) Int. Cl.⁷ ............................. B23K 1/20; B23K 31/02; C22C 13/00
(52) U.S. Cl. ............................................ 228/208; 420/557
(58) Field of Search ............................. 228/208; 420/524, 420/557

(56) References Cited

U.S. PATENT DOCUMENTS

| | | | |
|---|---|---|---|
| 2,733,168 | * 1/1956 | Hodge et al. ........................... | 117/50 |
| 4,247,036 | * 1/1981 | Salesse et al. ......................... | 228/194 |
| 4,352,450 | * 10/1982 | Edgington ............................. | 228/205 |
| 4,537,837 | * 8/1985 | Gunn et al. ........................... | 428/621 |
| 4,670,217 | * 6/1987 | Henson et al. ........................ | 420/562 |
| 4,854,495 | * 8/1989 | Yamamoto et al. ................... | 228/124 |
| 4,916,795 | * 4/1990 | Tan ..................................... | 29/402.18 |
| 4,996,111 | * 2/1991 | Do-Thoi et al. ....................... | 428/432 |
| 5,071,058 | * 12/1991 | Nowotarski ........................... | 228/219 |
| 5,147,471 | * 9/1992 | Kronberg ............................. | 420/556 |
| 5,316,206 | * 5/1994 | Syslak et al. ......................... | 228/183 |
| 5,378,346 | * 1/1995 | Ashiru et al. ......................... | 205/244 |
| 5,452,842 | * 9/1995 | Melton et al. ................... | 228/180.22 |
| 5,489,490 | * 2/1996 | Carey, II et al. ..................... | 428/647 |
| 5,597,656 | * 1/1997 | Carey, II et al. ..................... | 428/647 |
| 5,635,764 | * 6/1997 | Fujikawa et al. ..................... | 257/766 |
| 5,669,548 | * 9/1997 | Miyake et al. ....................... | 228/224 |
| 5,698,160 | * 12/1997 | Chen et al. ........................... | 420/557 |
| 5,759,379 | * 6/1998 | Cavallotti et al. .................... | 205/177 |
| 5,827,618 | * 10/1998 | Oyagi et al. .......................... | 428/621 |
| 5,942,185 | * 8/1999 | Nakatsuka et al. ................... | 420/562 |
| 5,965,278 | * 10/1999 | Finley et al. ......................... | 428/641 |

FOREIGN PATENT DOCUMENTS

0186411 * 7/1986 (EP) ..................................... 228/208

* cited by examiner

Primary Examiner—Patrick Ryan
Assistant Examiner—L. Edmondson
(74) Attorney, Agent, or Firm—Oblon, Spivak, McClelland, Maier & Neustadt, P.C.

(57) ABSTRACT

Disclosed is a method of joining metallic members together. The metallic members are coated with an undercoat composed of an alloy of tin and zinc and contacted with each other through a mixture containing a solder comprising tin and zinc and a flux, while heating the metallic members to melt the solder. Then the molten solder is solidified to join the metallic members. Here, the ratio of zinc in the undercoat is represented by x (% by weight), the ratio of zinc in the solder is represented by y (% by weight), and the ratio, x, and the ratio, y, are values within an area enclosed by the line A or B in FIG. 1, which satisfies the formulas: $1 \leq x \leq 20$, $3 \leq y \leq 13$ and $3 \leq (x+y)/2 \leq 13$, or formulas: $0.1 \leq x \leq 25$, $2 \leq y \leq 15$ and $2 \leq (x+y)/2 \leq 15$.

25 Claims, 2 Drawing Sheets

METHOD OF JOINING METALLIC MEMBERS, AND JOINED METALLIC MEMBERS

BACKGROUND OF THE INVENTION

1. Field of the Invention

The present invention relates to a method of joining metallic members such as electric or electronic parts together, using a conductive binder containing no lead, and to the joined metallic members, and more particularly, to a method of joining electric or electronic parts including circuit substrates together, using a solder paste composed of a tin and lead solder (Sn—Pb solder) and to the joined electric or electronic parts.

2. Related Art

Soldering is a technique of joining physical objects each other using a material with relatively low melting point and has been used since olden times. The origin of soldering is said to be able to go back to ancient Mesopotamian civilization. In modern industry, soldering is widely used in joining and mounting electronic devices. For example, in mounted substrates, soldering is used for joining and the like of mounting electronic parts of semiconductors, microprocessors, memories, resistors and others on substrates. Advantages of soldering reside in not only fixing of parts on substrates but also formation of electric connections by the conductivity of metals contained in the solder. In this point, solder is different from organic adhesives.

Solder generally used is an eutectic solder composed of tin and lead, the theoretical eutectic point of which is 183° C., and it is used in joining substrates and others. The tin and lead eutectic solder has the feature that it does not damage printed substrates and others with heat, because its eutectic point is lower than the temperatures that most of the thermosetting resins begin to gasify. Moreover, the eutectic solder is known that its tin component forms a peculiar metal compound layer in the interface of a copper plate to strengthen the adhesive strength between the solder and the copper plate more.

The eutectic solder composed of tin and lead with such features is important in joining and mounting parts in the manufacture of electronic devices. In the fine pitch soldering treatment which is required for thick film formation, conductive circuit formation, semiconductor mounting and others, a screen printing method or the like with solder paste, which is prepared by mixing a solder powder and a flux to form a paste, is used. Consequently, the demand of solder is more and more increasing in the technology of mounting electronic parts, with the rapid spread of personal devices represented by personal computers, cellular phones, pagers and the like.

The spread of electronic devices has made people's life comfortable. On the other hand, however, it is true that waste electronic devices are thrown away in large quantities, and it is feared that such waste may pollute the environment. For this reason, the recycle use of the waste and the manufacturing processes without the use of highly harmful materials have been proposed. In particular, the elimination of highly harmful materials is desirable in view of the prevention of the environmental pollution, and the jointing technology with soldering is also considered to be developed more.

Although the tin and lead eutectic solder has a characteristic that its wetting property to base materials is better than those of other metal mixtures, lead contained in the above solder is feared that in a case of the landfill of thrown electronic devices, their exposure to acid rain for a long time may elute lead ion into the soil to cause a problem of poisoning. To solve this problem, the technique of immobilizing lead is proposed, but no sufficient data extended for a long period of time are obtained about the diffusion of lead into the soil. Moreover, according as memory elements have become to be high-density in recent years, the damage of electronic devices due to radiation (αray) from lead has been highlighted and it is required to reconsider the use of lead in the respect of coping with high-density mounting in semiconductor devices.

In the above circumstances, joining techniques with solder containing no lead are required. However, the solder in which lead is replaced with other metal and the solder composed of a combination of other metals are very inferior in wetting property and do not show enough joining property. For example, although the use of various kinds of solder composed of tin and zinc, tin and silver, and others has been tried, their wetting property is inferior to the solder composed of tin and lead. Furthermore, solder containing silver is difficult to be used in large quantities as a product for wide use because silver itself is a noble metal and so its applications are easily limited into special regions.

In joining and mounting electric and electronic parts in present situation, because devices and equipment for a screen printing method with solder paste have been spread in manufacturing sites, solder paste of solder not containing lead is desired to be put to practical use. However, at present, the practical use of solder paste in a complicated system like tin, silver and bismuth solder is only barely tried, and part mount using solder paste without lead has been scarcely put to practical use. As for this reason, it is also considered that a part fabrication process or the like can not be realized economically using such a method that a special atmosphere or environment is necessary for working surroundings.

SUMMARY OF THE INVENTION

It is therefore the primary object of the present invention to provide a method of joining metallic members by soldering using a solder composed of widely usable metals and containing no lead in order to prevent the environmental pollution by lead contained in waste.

The secondary object of the present invention is to provide a method of joining metallic members, thereby parts being able to be easily joined using tin and zinc solder even in the atmosphere of air.

In order to achieve the above-mentioned objects, a method of joining a plurality of metal members together, according to the present invention, comprises the steps of: coating said plurality of metal members with an undercoat composed of an alloy of tin and zinc; contacting the metal members with each other through a mixture containing a solder comprising tin and zinc and a flux, while heating the metal members to melt the solder; and solidifying the molten solder to join the metal members, wherein the ratio of zinc in the undercoat is represented by x (% by weight), the ratio of zinc in the solder is represented by y (% by weight), and the ratio, x, and the ratio, y, are values such as satisfy the following formulas.

$$1 \leq x \leq 20,\ 3 \leq y \leq 13,\ 3 \leq (x+y)/2 \leq 13$$

In another aspect of the present invention, a method of joining metal members together comprises the steps of: coating said plurality of metal members with an undercoat composed of tin and zinc; contacting the metal members with each other through a mixture containing a solder comprising tin and zinc and a flux, while heating the metal members to remove the flux and melt the solder; and solidifying the molten solder to Join the metal members, wherein the ratio of zinc in the undercoat is represented by x (% by weight), the ratio of zinc in the solder is represented by y (% by weight), and the ratio, x, and the ratio, y, are values such as satisfy the following formulas.

$$0.1 \leq x \leq 25, \ 2 \leq y \leq 15, \ 2 \leq (x+y)/2 \leq 15$$

In further aspect of the present invention, a method of joining a pair of metal members together, comprises the steps of: coating one of the metal members with a first undercoat composed of tin and zinc; coating the other of the metal member with a second undercoat composed of tin and zinc; contacting the metal members with each other either through a flux or in a reducing atmosphere, while heating the metal members to melt at least one of the first undercoat and the second undercoat; and solidifying the molten undercoat to Join the metal members, wherein the ratio of zinc in the first undercoat is represented by x (% by weight), the ratio of zinc in the second undercoat is represented by y (% by weight), and the ratio, x, and the ratio, y, are values such as satisfy the following formulas.

$$1 \leq x \leq 20, \ 3 \leq y \leq 13, \ 3 \leq (x+y)/2 \leq 13$$

The features and advantages of the Joining method, according to the present invention over the conventional art will be more clearly understood from the following description of the preferred embodiments of the present invention taken in conjunction with the accompanying drawings.

DETAILED DESCRIPTION OF THE PREFERRED EMBODIMENTS

There are various kinds of solder according to the kind of metals to be used and the combination, and they can be classified as high temperature solder (melting point is 280° C. or more), ordinary solder (melting point is from 183 to 280° C.) and low temperature solder (melting point is 183° C. or less). The solder which is generally used is ordinary solder having eutectoid composition of tin and lead. Because lead is a component to give wetting property to the solder, solder not containing lead, for example, solder composed of tin and zinc, of silver and tin and the like, is inferior in wetting property and it is hard to adhere to base metals. For this reason, in order to compensate for the low wetting property of the solder containing no lead, it has been tried to add another metal component to this solder and mix with a flux for use as solder paste. But the trials have scarcely succeeded in attaining the wide use of such solder. As this reason, it is considered that, since a considerably high activity is necessary for the flux to compensate for the wetting property of the solder, suitable fluxes are limited and the shelf life of the solder paste is extremely reduced by the activity of the flux. In particular, in solder paste of a series of tin and zinc solder, the wetting property of tin and zinc solder itself is low, and moreover, the wetting property is apt to deteriorate due to easy oxidization of zinc and high melting temperature is necessary. Consequently, if a highly active flux is used so that the solder can exhibit satisfactory wetting property even in reflow in the atmosphere of air, the preservation of solder paste will become very difficult and its quality will also become unstable.

In the present invention, it is possible to utilizes devices and equipment for the conventional screen printing method and join and mount parts using solder paste containing a flux of low activity and being able to be preserved. That is, in the method of the present invention, the surface of the metal members to be joined is coated, in advance, with an undercoating material composed of tin and zinc, and the undercoated metal members are then applied with solder paste and further reflowed. The solder paste to be coated on the metal members contains solder powder which is composed of tin and zinc, and a flux. The ratio of zinc contained in an undercoating material and that of the solder powder are set in the particular ranges as shown in FIG. 1.

Figure 1:
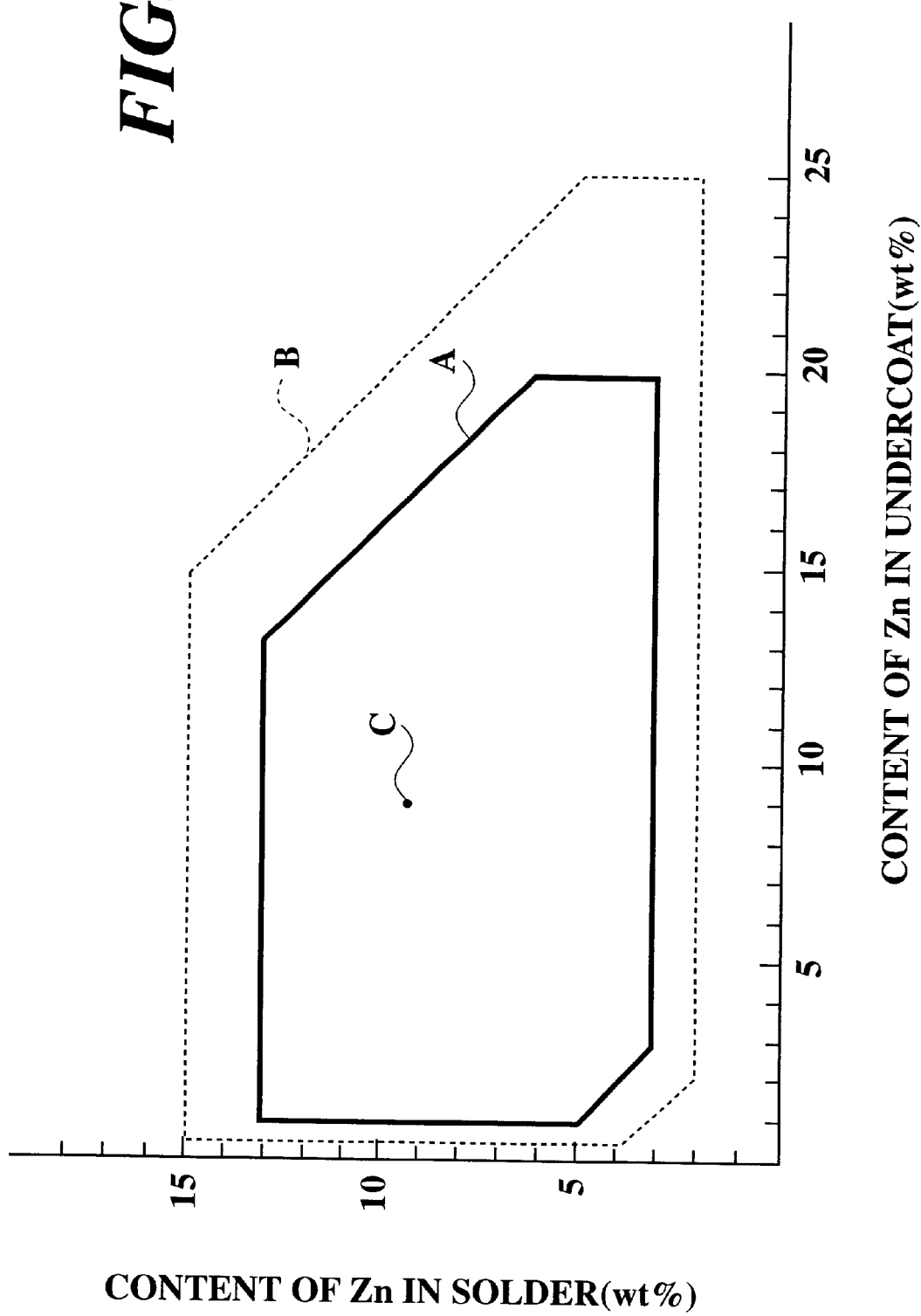
FIG. 1 is a graph showing the relationship between the reflow temperature (the maximum heating temperature) at which metallic members are Joined and the content of zinc which is contained in each of an undercoat and a solder in solder paste.

FIG. 1 is a graph showing the relationship between the reflow temperature (the maximum heating temperature) and the contents of zinc contained in the undercoating material and in the solder powder, and the reflow temperature is a temperature that, when the undercoated metal members are applied with the solder paste and reflowed in the air, the solder powder and the undercoating material can melt and join metal members tightly. The X-axis of FIG. 1 indicates the content of zinc which is contained in the undercoating material and the Y-axis is the content of zinc contained in solder powder, that is, the solder of the solder paste, and the combinations of a undercoating material and solder powder to form excellent joints at a reflow temperature of 205° C. are shown by the line A, and the combinations of them to form excellent joints at a temperature of 235° C. are shown by the line B. Now, in drawing up this graph, such undercoating materials and solder powder were used that the ratio of contained oxygen is less than 50 ppm and the ratio of contained metal components except tin and zinc is less than 0.1 wt %.

In the figure, in a case where both of the undercoating material and the solder powder are tin and zinc eutectic alloys (Zinc is 9 wt %, the temperature of the theoretical eutectic point is 199° C.), which is indicated by the point C in the figure), if reflow temperature is more than the temperature of the theoretical eutectic point, metal members will be suitably joined. In other words, when the reflow temperature is set at 235° C., metal members can be joined by the combinations of an undercoating material and a solder powder respectively having a ratio of the contained zinc within the region enclosed by the line B, and when reflow temperature is 205° C., the joining is possible by the combinations of an undercoating material and a solder powder respectively having a ratio of contained zinc within the region enclosed by the line A. Each of the regions enclosed by the line A and the line B in FIG. 1 is approximately expressed by the following A formulas wherein the ratio of zinc contained in the precoating material is x (wt %) and the rate of zinc contained in the solder powder is y (wt %);

The region according to the line A:

$$1 \leq x \leq 20, \ 3 \leq y \leq 13 \text{ and } 3 \leq (x+y)/2 \leq 13$$

The region according to the line B:

$$0.1 \leq x \leq 25, \ 2 \leq y \leq 15 \text{ and } 2 \leq (x+y)/2 \leq 15$$

Figure 2:
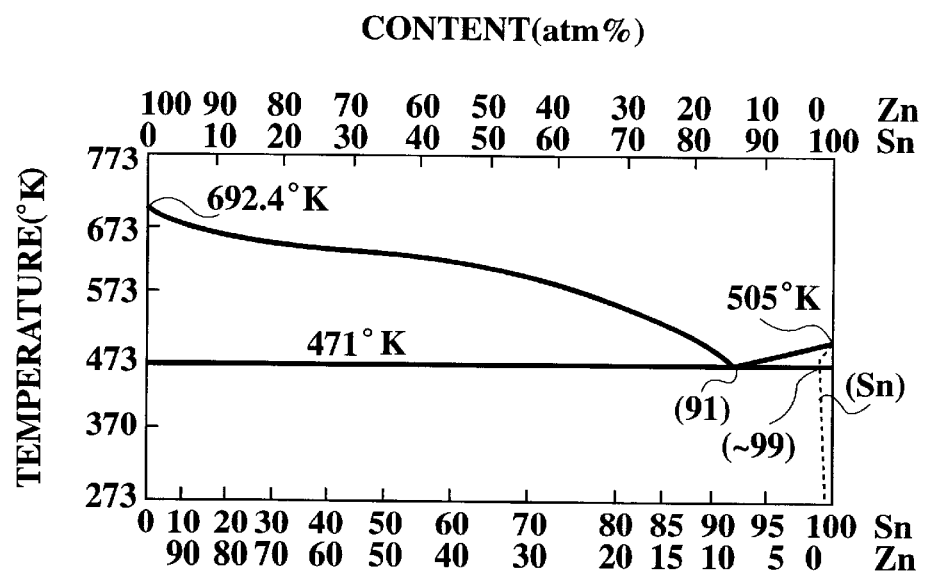
FIG. 2 is a phase diagram of the binary system of tin and zinc.

In the reflow operations, when the undercoating material and the solder paste are heated and a flux is vaporized or decomposed, the solder powder and the undercoating material are contacted each other. In this state, if heating temperature reaches the temperature of the eutectic point, as being understandable from the phase diagram of the tin and zinc binary system shown in FIG. 2, it is theoretical that a liquid phase having the eutectic composition is produced. Accordingly, the liquid phase of the eutectic composition begins to be produced in the solder powder and the undercoating material, and diffusion and mixing can be easily caused with the liquid phase through the contact interface between the undercoating material and the solder powder, which further promotes production of the liquid phase. Moreover, if the temperature exceeds that of the eutectic point, tin or zinc which remains as a solid phase melts according to the temperature and spread into the liquid phase, and melt completely when the temperature reaches the liquidus temperature. Even in a case where the composition of the undercoating material differs from that of the solder powder, if heating temperature reaches the temperature of eutectic point, a liquid phase of the eutectic composition begins to be produced and the progress of the liquid phase is accelerated especially in the neighborhood of the contact interface. This is because the compositionin in the neighborhood of the contact interface is acceleratedly uniformed by spreading and mixing through the contact interface. If the temperature reaches the liquidus temperature in the average composition of the mixture of the undercoating material and the solder powder, both materials are completely melted and mixed. Consequently, if the average composition of the undercoating material and the solder powder is nearer to the eutectic composition than each composition is, the liquidus temperature of the mixed composition of both materials will be lower than that of each material, and the mixed composition will completely melt at lower temperatures than the melting point of each material. If the solder powder completely melts to form a uniform liquid phase, the surface tension of molten solder will be decreased and the wetting property exhibited by the molten solder will be improved.

As mentioned above, in a case where a composition material of tin and zinc is melted and joined together with another similar composition material through the reflow process, the wetting property at the time of melting is more easily obtainable compared with reflow joining with an other metal, and consequently, it becomes possible to join parts even if the reflow process is carried out in the air. Moreover, considering that solid metals are harder to be oxidized than molten metals, it is very favorable in the point of preventing oxidation of the solder and the undercoating material and of maintaining wetting property that melting of the solder powder and the undercoating material proceeds from the contact interface of each material. Incidentally, in the present invention, it is sufficient so long as the solder powder melts and exhibits favorable wetting property, and the complete melting of the whole undercoating material is not always needed.

As mentioned above, it is further understood that the solder powder does not always have to be powder of a tin and zinc alloy. That is, even a mixture of tin powder and zinc powder, a mixture of tin and zinc alloy powder and tin powder or zinc powder, or an ununiform mixture or combination of tin and zinc will exhibit enough wetting property for soldering through the above-mentioned processes. Moreover, the undercoat does also not always have to be a uniform coating.

Further, a metal in the state of liquid phase, especially zinc, is apt to absorb oxygen to be oxidized, and consequently, the amount of its oxide increases according as the duration of the state of liquid phase increases in the reflow process in the air. Moreover, the higher the heating temperature is, the more the oxidation of metals progresses. If the amount of metal oxides increases, the melting temperature of the solder rises and its wetting property decreases. Consequently, it is very profitable to be able to set reflow temperature low. In addition, since joined electric and electronic parts are apt to be easily damaged by heat when reflow temperature is high, it is preferable to be able to join electric and electronic parts at low temperature.

In addition, if the amount of oxygen or oxide contained in the solder powder and the undercoating material themselves to be used is much, similarly the melting temperatures of the solder powder and the undercoating material rise and the wetting property decreases. Consequently, when a solder powder and/or a undercoating material containing much oxygen is used, even though the surfaces of the undercoating material and the solder powder are activated with a flux, melting temperature is high in their interiors owing to oxides, and the reflow temperature must be high. As a result, when the solder paste is applied on undercoated metal members and then the metal members are reflowed, the reflow temperature for joining the metal members firmly shifts from those in FIG. 1. In the conventional soldering and joining with solder paste, dip temperature or reflow temperature is necessary to be set about 50° C. higher than liquidus temperature of the solder composition, and the main reason of this is considered to reside in the above point. Consequently, it is desirable for the solder powder and the undercoating material to be used to contain oxygen or oxides little, preferably 100 ppm oxygen or less.

The method of undercoating the metal members to be Joined are not specially limited, and it is allowed to select and use a proper method from various kinds of coating methods, including the methods which are called Super Solder Method or Super Jafit Method, the electroplating method, the electroless plating method, the electrophoresis method, the chemical vapor deposition method, the sputtering method, the physical vapor deposition method, the ion implantation method, the plasma spraying method, the diffusion bonding method, the deformation bonding method, the dip method, the pressure welding method and the like, as occasion arises. It is suitable to set the thickness of the undercoat about 5 $\mu$m or more, preferably from 10 to 50 $\mu$m.

In a case where the dip method is used to undercoat the tin and zinc alloy on the metal members, it is possible to improve the wetting property of the tin and zinc alloy by dipping metal members into the molten tin and zinc alloy in the nonoxidative atmosphere. In particular, if a tin and zinc alloy that the contents of oxygen and other metal components as impurities and the like are little is used, its wetting property is improved well and its melting temperature (dip temperature) can be brought close to the liquidus temperature. In addition, when metal members are dipped, if vibrational energy caused by elastic waves like ultrasonic waves and the like is given directly or indirectly to the metal members, oxide films and the like on the surface of the metal members will be removed and the wetting property of the metal members will be improved to result in good coating. Or, it is also acceptable to rinse the surface of the metal members with acid or flux treatment just before dipping them. In a case of undercoating metals of bumps and pads provided on a substrate like a circuit substrate, an excess of the tin and zinc alloy may slightly adhere to the surface of the substrate or the undercoated layer in the shape of particles or whiskers. It is preferable to remove such particles or whiskers before the reflow process because it is feared that they may cause troubles or decrease of the appearance. Because the tin and zinc alloy which adheres to the substrate in the dip method is extremely small quantities of particles and their adhesion is not strong, they can be easily removed using a brush with nylon hair, pig hair or the like. For example, using a cylindrical nylon brush rotating at a rotational speed of about 200 to 5,000 rpm, it is possible to polish the substrate efficiently by making it move at a speed of about 0.1 to 5 m/min. and pass under the nylon brush. At this time, it is acceptable to provide and spray water or the like to cool the substrate. Such cleaning with a brush can not only simply remove whiskers and the like of an excess of the tin and zinc alloy but also improve the wetting property by polishing the undercoated surface.

On the metal members undercoated by the abovementioned method, the solder paste prepared by combining a flux with powder of a tin and zinc alloy is applied. The powder composition of the tin and zinc alloy contained in this paste can be changed as mentioned above, as necessity arises.

If the solder powder is tin and zinc solder purified so that impurities of metal except tin and zinc is 0.1 wt % or less and concentration of the contained oxygen is 1,000 ppm or less, preferably 100 ppm or less, the solder powder is good in wetting property and needs no substance with high activity as a flux. The solder like the above is processed to prepare granules of about 4 to 100 $\mu$m in particle size, preferably about 10 to 50 $\mu$m or less, and then mixed with a flux for paste to prepare solder paste. The thickness of applied solder paste is preferable to be about 150 to 200 $\mu$m. The solder powder and the flux are usually mixed in the ratio of about 9:1. The solder paste applied on the metal member decreases to about ½ in volume by reflowing.

A flux for preparing the tin and zinc solder paste can be properly selected from flux components to be used in general solder paste. In selecting a flux, it should be considered that the solder powder does not separate from the flux, the prepared paste can be easily printed, the residue of the flux is not corrosive but insulative, and others. For example, R(Rosin)-type fluxes with a base (main component) of rosin, gum rosin, wood rosin, polymerized rosin, or rosin derivatives such as denatured rosin with phenol, RMA(Rosin mild activated)-type fluxes and the like can be used. As components to be combined with the flux as an activating agent, organic amine hydrohalides, organic acids, organic amines and the like are given for example, and diphenylguanidine hydrobromide, cyclohexylamine hydrobromide, diethylamine hydrochloride, adipic acid, sebacic acid, triethanol amine, monoethanol amine and the like are suitable. As components to be combined with the flux as a thixotropic agent, hydrogenated castor oil, fatty acid amides, oxyfatty acids and the like are given. A flux can be obtained by mixing these components using a solvent, if necessary. As a solvent to be used in solder paste, watersoluble organic solvents of relatively low viscosity are properly used, and 2-alkyl-1,3-hexanediol is preferable because it is especially suitable to apply the solder paste by a printing method. If a flux is prepared so that the content of rosin derivatives as main components is about 30 to 80 wt %, various kinds of activating agents are about 5 wt % or less and the rest is a solvent, it is possible to reduce the amount of the flux residue during the reflow process to a small amount. The flux is prepared in the following process; rosin derivatives, activating agents, thixotropic agents and a solvent are mixed and heated to a homogeneous solution and then cooled. Thus obtained flux is mixed with solder powder uniformly, thereby the solder paste can be prepared. From the viewpoint of the viscosity of the obtained solder paste, the ratio of the solder powder is preferable to be 85 to 92 weight parts relative to 8 to 15 weight parts of the flux.

In particular, a flux which contains 40 to 50 wt % of rosin, 2 to 3 wt % of an activating agent, 5 to 10 wt % of a thixotropic agent and 25 to 35 wt % of a solvent and furthermore is combined with 5 to 10 wt % of an organic acid such as palmitic acid and 1 to 3 wt % of an organic halide compound such as dibromo propanol is very useful to join parts using a undercoating material of a tin and zinc alloy.

The tin and zinc solder paste prepared as mentioned above is applied on the metal member to be joined, which has an undercoat of a tin and zinc alloy on its surface, using a technique like a screen printing method and others, and another metal member to be joined is then contacted with the metal member applied with the solder paste in a pair and reflowed. In the reflow process, the above-mentioned flux activates the surfaces of the undercoating material and the solder powder, and they are brought into contact by heating at temperatures of about 100 to 170° C. In succession, the solder powder and the undercoating material are molten by heating at the above-mentioned reflow temperature. Then being cooled, the metal members are joined by soldering. The time of heating them at reflow temperature is preferable to be 30 sec. or less in a case where the temperatures is 200° C. or more. If they are heated to 240° C., the heating time is preferably 10 sec. or less. Oxidation of solder will easily progress if heating is continued more than needed. Though the reflow process can be operated in the atmosphere of air, of course, it is more effective to operate it in a non-oxidizing atmosphere. When the reflow process is operated in the non-oxidizing atmosphere, some oxidation of the solder powder and the undercoating material is prevented, sharp cut in the melting condition or low viscosity of the tin and zinc alloy is kept and the alloy can cope with fine joining, e.g., joining of parts on a high density mounting substrate.

Metal members to be Jointed are only needed to be able to be undercoated. The above-mentioned joining method is applicable not only to metal members made of a simple metal such as copper, silver, gold, nickel, aluminum and the like but also to alloy materials such as SUS stainless steel, composite metal materials and the like. Moreover, the joining method can fully cope with precise solder joining and it can also cope with solder joining of fine line-form metal members having narrow spaces on such a level that members of about 0.3 mm in line width and line space can be joined. Consequently, the joining method can be used in solder joining for mounting substrates and for joining electric and electronic parts. As examples of the electric and electronic parts, IC packages used in the semiconductor field, electric conductive parts of CPUs, hard disks to be built into personal computers, electrical circuits of liquid crystal panels, IC cards, cable connectors used for the connection of personal computers or printers, optical connectors used in transmission cables, radiators for automobiles and others are given. The mounting forms of substrates include mounting of one side surface, mounting of both side surfaces, mounting of both side surfaces and installing parts with leads, mounting of one side surface and installing parts with leads, lead through mounting and others, and the joining method of the present invention can be applied to all of them. Furthermore, as for the mounting parts, ceramic condensers, inductors, jumpers, transistors, diodes, aluminum electrolytic condensers, tantalum semifixed resistances, trimmers, coils and others are given as examples of passive parts, and ICs, SIs and the like are representative examples of active parts. As the type of package form given are SOIC, SOP, QIP, QFP, PLCC, LCC, SOJ, MSP, BGA, FC-BGA, CSP, PLC, MCM, OE-MCM, high-density chips in which plural chips are piled up and the like.

It is possible to appropriately select the composition of the undercoating material and a method of undercoating according to the quality of the material of metal members to be joined.

In addition, the present invention can be modified to join metal members in which only the undercoating material and the flux are used without use of solder powder. Specifically, the compositions of undercoating materials which coat a pair of metal members to be joined is set in such a manner that the combination of the zinc contents of said pair of the undercoating materials is a value combination (x, y) within the range enclosed by the line A or the line B in FIG. 1. Then the undercoated metal members are applied with the flux described above on the undercoated layer and contacted with each other. Or, the metal members are placed in the reducing atmosphere to contact with each other. The metal members contacted with each other are reflowed. As a result, diffusion coalescence is promoted from the contact interface between the undercoated layers to join the metal members firmly. In this case, it is preferable that the ratio of zinc contained in the undercoated layer of the metal member which is placed on the upper side between the opposite metal members is set to correspond to the ratio in the solder of the solder paste in FIG. 1.

As the above-mentioned reducing atmosphere, the atmosphere in which a gaseous reducing substance is contained in an inert gas such as nitrogen and the like in proper quantity is suitably used. Gaseous reducing substances include hydrogen, vaporized alcohol such as methanol vapor, ethanol vapor, propanol vapor and the like, vaporized acid such as formic acid vapor, acetic acid vapor and the like.

As mentioned above, according to the construction of the present invention, the joint of parts using widely usable solder composed of tin and zinc without lead can be realized by utilizing existing devices and equipment for the solder paste which is used in the present assembling and manufacturing processes of electric and electronic assemblies.

Since alloy of tin and zinc is used for both of the metal members to be undercoated and the solder powder and no other metal component is used, the composition of the joint part does not become complicated. As a result, after having been jointed, joint parts and jointed objects are easily treated in recovery and recycling and advantageous in the reuse of recovered metals.

EXAMPLES

Now, the present invention is described below in detail with reference to the examples.

Example 1

Ninety one weight parts of metal tin and 9 weight parts of metal zinc were heated and melted under reduced pressure to prepare tin and zinc solder having the composition that tin is at least 90.9 wt %, zinc is 9 wt %, and the total amount of other trace elements is less than 0.1 wt %, and the concentration of contained oxygen is 6 ppm. This solder was then granulated in the atmosphere of nitrogen to obtain solder powder of 20 to 50 $\mu$m in size distribution. On the other hand, 57 weight parts of polimerized rosin (turpentine), 26 weight parts of turpineol as a solvent, 10 weight parts of hardened castor oil (a thixotropic agent), 2 weight parts of diphenylguanidine hydrobromide (an activating agent), 3 weight parts of palmitic acid and 2 weight parts of 2,3-dibromo-1-propanol were heated while being mixed. Then the mixture was cooled to prepare a homogeneous flux. A solder paste was obtained by mixing and stirring 10 weight parts of the flux with 90 weight parts of the above-obtained solder powder in the atmosphere of nitrogen.

In addition, 91 weight parts of metal tin and 9 weight parts of metal zinc were heated and melted in the atmosphere of nitrogen to prepare molten solder of tin and zinc. Then a substrate with the following specifications was irradiated with elastic waves of 28 kHz in frequency for 10 seconds while being dipped in the molten solder to undercoat the copper pad pattern of the substrate with the tin and zinc solder.

[Specifications of the Substrate]

Dimensions: 100 mm in length×120 mm in width×1 mm in thickness.

The quality of the material: Glass epoxy resin applied with a solder resist.

Pattern in a copper pad: A pattern of corresponding to 168 pin QFP.

Dimensions of a copper pad: 5 mm in length×0.3 mm in width, space between the copper pads: 0.5 mm.

The above-mentioned solder paste was then supplied to the metal mask of a printer for circuit substrates and applied on the undercoated substrates by the squeegee printing method in a nitrogen stream according to the following printing conditions.

[Printing Conditions]

Metal mask thickness: 1.2 mm, Printing speed: 1.5 times/min.

Printing direction: In the longitudinal direction of the substrate.

The printing was repeated 500 times by the printer, and no special change was observed in the physical properties such as stickiness and others of the solder paste.

Figure 3:
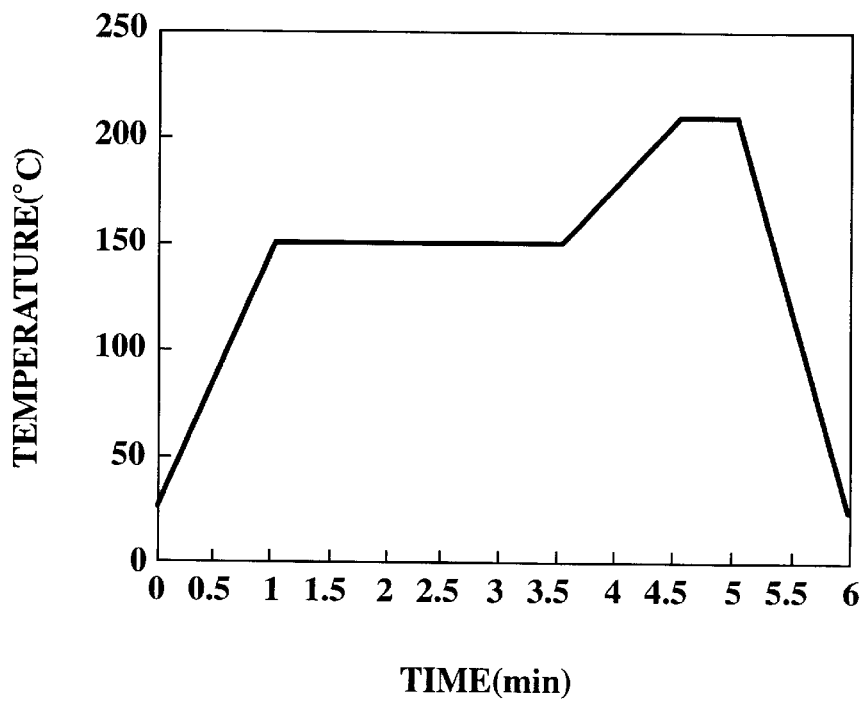
FIG. 3 is a graph showing an example of temperature profiles in reflow of a joining method according to the present invention.

In addition, one of the 500 substrates on which the solder paste had been printed and applied was installed on a chip mounter and a QFP chip undercoated with a tin and zinc alloy (composition: zinc is 9 wt %) was positioned to a predetermined place on the substrate and fixed thereto. Then the chip mounter was introduced into a heating furnace and reflow was carried out in the following conditions according to the temperature profile shown in FIG. 3.

[Reflow Conditions]

Reflow time: 6 min.

Preheating temperature: 150° C.

Maximum heating temperature: 210° C.

Atmosphere of the inside of the furnace: air.

After the reflow, the substrate was cooled. Then its joint part was cut and the wetting property of solder was examined by observing the section. As a result, the wetting angle of solder was an acute angle and no bridge formation was found in the respective spaces between the lands. Furthermore, no sticking of unintended solder ball occurred, and the wetting property was good.

Other substrates were also reflowed. The ratio of occurrence of inferior soldering was found to be 0.6% by examining 500 substrates.

Example 2

Ninety seven point five weight parts of metal tin and 2.5 weight parts of metal zinc were heated and melted under reduced pressure to prepare tin and zinc solder having the composition that tin is at least 97.4 wt %, zinc is 2.5 wt %, and the total amount of other trace elements is less than 0.1 wt %, and the concentration of contained oxygen is 4 ppm. This solder was granulated in the atmosphere of nitrogen to obtain solder powder of 20 to 50 μm in size distribution.

On the other hand, a solder paste was obtained by mixing and stirring 10 weight parts of a flux prepared by the similar operation in Example 1 and 90 weight parts of the above-mentioned solder powder in the atmosphere of nitrogen.

Moreover, 91 weight parts of metal tin and 9 weight parts of metal zinc were heated and melted in the atmosphere of nitrogen to prepare molten solder. Then a substrate with the same specifications as that of the substrate used in Example 1 was irradiated with elastic waves of 28 kHz in frequency for 15 seconds while being dipped in the molten solder to undercoat the copper pad pattern of the substrate with tin and zinc solder.

The above-mentioned solder paste was then supplied to the metal mask of a printer for circuit substrates and applied on the undercoated substrates by the squeegee printing method in a nitrogen stream according to the same printing conditions as Example 1.

The printing was repeated 500 times by the printer, and no special change was observed in the physical properties such as stickiness and others of the solder paste.

In addition, one of 500 substrates on which the solder paste had been printed and applied was installed on a chip mounter and a QFP chip undercoated with a tin and zinc alloy (Composition: zinc is 9 wt %) was positioned to a predetermined place on the substrate and fixed thereto. Then, the chip mounter was introduced into a heating furnace. After that, the reflow process was operated in the same conditions as Example 1, except that the maximum heating temperature was raised from 210° C. to 235° C.

After the reflow, the substrate was cooled. Then its joint part was cut and the wetting property of solder was examined by observing the section. As a result, the wetting angle of solder was an acute angle and no bridge formation was found in the respective spaces between the lands. Furthermore, no sticking of unintended solder ball occurred and the wetting property was good.

Other substrates were also reflowed. The ratio of occurrence of inferior soldering was found to be 0.8% by examining 500 substrates.

Comparative Example 1

Ninety-eight point five weight parts of metal tin and 1.5 weight parts of metal zinc were heated and melted under reduced pressure to prepare tin and zinc solder having the composition that tin is at least 98.4 wt %, zinc is 1.5 wt %, and the total amount of other trace elements is 0.1 wt % or less, and the concentration of contained oxygen is 4 ppm. This solder was granulated in the atmosphere of nitrogen to obtain solder powder of 20 to 50 μm in size distribution.

Repeating the same operations as Example 1 except for the use of the above-mentioned solder powder, the substrate was undercoated, and a QFP chip was mounted through the preparation and application of solder paste and reflowing. The ratio of occurrence of inferior soldering was found to be 3% by examining 500 substrates.

Comparative Example 2

Repeating the same operations as Example 2 except that the maximum heating temperature in the reflow process was lowered to 210° C., the substrate was undercoated, and a QFP chip was mounted through the preparation and application of solder paste and reflowing.

The ratio of occurrence of inferior soldering in the reflow treatment was found to be 5% by examining 500 substrates.

According to the present invention, a method of joining metal members using tin and zinc solder is provided and soldering of parts with fine and complicated shape can be achieved even by the use of solder containing no lead. Consequently, joint parts of various kinds of devices and the like can be joined by using solder containing no lead. As a result, the amount of lead contained in waste can be reduced, which is effective in recycling of waste. Therefore, joined objects obtained by the method of the present invention are extremely excellent in industries and in measures for the environment.

It must be understood that the invention is in no way limited to the above embodiments and that many changes may be brought about therein without departing from the scope of the invention as defined by the appended claims.

What is claimed is:

1. A method of joining a pair of metallic members together, comprising the steps of:

preparing said pair of metallic members in coated form, wherein one of the metallic members is coated with a first undercoat composed of tin and zinc and the other of the metallic members is coated with a second undercoat composed of tin and zinc;

contacting the metallic members with each other either through a flux or in a reducing atmosphere, while heating the metallic members to melt at least one of the first undercoat and the second undercoat; and solidifying the molten undercoat to join the metallic members, wherein the ratio of zinc in the first undercoat is represented by x (% by weight), the ratio of zinc in the second undercoat is represented by y (% by weight), and the ratio, x, and the ratio, y, are values such as satisfy the following formulas:

$$1 \leq x \leq 20,\ 3 \leq y \leq 13,\ 3 \leq (x+y)/2 \leq 13$$

and the relationship that the composition of the mixture of the first undercoat and the second undercoat comes to or is closer to the Sn—Zn eutectic composition than each composition of the first undercoat and the second undercoat, wherein the content of other metals than zinc and tin which is contained in each of the first undercoat and the second undercoat is 0.1% by weight or less.

2. The joining method of claim 1, wherein the metallic members at the contacting step are heated in such a manner that the maximum temperature is 205° C. or more.

3. The joining method of claim 1, wherein the metallic members at the contacting step are heated in such a manner that the maximum temperature is 240° C. or less.

4. The joining method of claim 1, wherein the content of oxygen in each of the first undercoat and the second undercoat is 100 ppm or less, and the metallic member at the contacting step is heated in an atmosphere in which the content of oxygen is 1000 ppm or less.

5. The joining method of claim 1, wherein the flux includes rosin flux, and the content of halogen in the flux is 0.06% by weight or less.

6. The joining method of claim 1, further comprising, before the contacting step, the step of:

cleaning the metallic members coated with the first or second undercoat to remove an excess portion of the first or second undercoat.

7. A method of joining a plurality of metallic members together, comprising the steps of:
coating said plurality of metallic members with an undercoat composed of an alloy of tin and zinc;
contacting the metallic members with each other through a mixture containing a solder comprising tin and zinc and a flux, while heating the metallic members to melt the solder; and
solidifying the molten solder to join the metallic members,
wherein the ratio of zinc in the undercoat is represented by x (% by weight), the ratio of zinc in the solder is represented by y (% by weight), and the ratio, x, and the ratio, y, are values such as satisfy the following formulas $$1 \leq x \leq 20, 3 \leq y \leq 13, 3 \leq (x+y)/2 \leq 13$$

and wherein the composition of the mixture of the undercoat and of the solder comes to or is closer to the tin-zinc eutectic composition than each composition of the undercoat and the solder.

8. The joining method of claim 7, wherein the metallic members at the contacting step are heated in such a manner that the maximum temperature is 205° C. or more.

9. The joining method of claim 7, wherein the metallic members at the contacting step are heated in such a manner that the maximum temperature is 240° C. or less.

10. The joining method of claim 7, wherein the solder is a powder of an alloy of tin and zinc, and the undercoat and the solder each have a composition such that, when the undercoat is mixed with the solder to obtain a mixture, the composition of the mixture is substantially a eutectic composition of zinc and tin.

11. The joining method of claim 7, wherein the solder is a powder of an alloy of tin and zinc, and the undercoat and the solder each have a composition such that, when the undercoat is mixed with the solder to obtain a mixture, the composition of the mixture is closer to a eutectic composition of zinc and tin than the composition of the undercoat or the composition of the solder.

12. The joining method of claim 7, wherein the content of other metals than zinc and tin which is contained in each of the undercoat and the solder is 0.1% by weight or less, the content of oxygen in the solder is 100 ppm or less, and the metallic members at the contacting step are heated in an atmosphere in which the content of oxygen is 1000 ppm or less.

13. The joining method of claim 7, wherein the flux includes rosin flux, and the content of halogen in the flux is 0.06% by weight or less.

14. The joining method of claim 7, further comprising, before the contacting step, the step of:
cleaning the metallic members coated with the undercoat to remove an excess portion of the undercoat.

15. A method of joining metallic members together, comprising the steps of:
coating said plurality of metallic members with an undercoat composed of tin and zinc;
contacting the metallic members with each other through a mixture containing a solder comprising tin and zinc and a flux, while heating the metallic members to remove the flux and melt the solder; and
solidifying the molten solder to join the metallic members,
wherein the ratio of zinc in the undercoat is represented by x (% by weight), the ratio of zinc in the solder is represented by y (% by weight), and the ratio, x, and the ratio, y, are values such as satisfy the following formulas $$0.1 \leq x \leq 25, 2 \leq y \leq 15, 2 \leq (x+y)/2 \leq 15$$

and wherein the composition of the mixture of the undercoat and the solder comes to or is closer to the tin-zinc eutectic composition than each composition of the undercoat and the solder.

16. The joining method of claim 15, wherein the metallic members at the contacting step are heated in such a manner that the maximum temperature is 235° C. or more.

17. The joining method of claim 15, wherein the ratio, x, and the ratio, y, are values such as satisfy the following formulas:

$$1 \leq x \leq 20, 3 \leq y \leq 13, 3 \leq (x+y)/2 \leq 13$$

and the metallic members at the contacting step are heated in such a manner that the maximum temperature is 205° C. or more.

18. The joining method of claim 15, wherein the metallic members at the contacting step are heated in such a manner that the maximum temperature is 240° C. or less.

19. The joining method of claim 15, wherein the solder is a powder of an alloy of tin and zinc, and the undercoat and the solder each have a composition such that, when the undercoat is mixed with the solder to obtain a mixture, the composition of the mixture is substantially a eutectic composition of zinc and tin.

20. The joining method of claim 15, wherein the solder is a powder of an alloy of tin and zinc, and the undercoat and the solder each have a composition such that, when the undercoat is mixed with the solder to obtain a mixture, the composition of the mixture is closer to a eutectic composition of zinc and tin than the composition of the undercoat or the composition of the solder.

21. The joining method of claim 15, wherein the content of other metals than zinc and tin which is contained in each of the undercoat and the solder is 0.1% by weight or less, the content of oxygen in the solder is 100 ppm or less, and the metallic members at the contacting step are heated in an atmosphere in which the content of oxygen is 1000 ppm or less.

22. The joining method of claim 15, wherein the flux includes rosin flux, and the content of halogen in the flux is 0.06% by weight or less.

23. The joining method of claim 15, further comprising, before the contacting step, the step of:
cleaning the metallic members coated with the undercoat to remove an excess portion of the undercoat.

24. A method of joining a pair of metallic members together, comprising the steps of:
coating one of the metallic members with a first undercoat composed of tin and zinc;
coating the other of the metallic members with a second undercoat composed of tin and zinc;
contacting the metallic members with each other either through a flux or in a reducing atmosphere, while heating the metallic members to melt at least one of the first undercoat and the second undercoat; and solidifying the molten undercoat to join the metallic members, wherein the ratio of zinc in the first undercoat is represented by x (% by weight), the ratio of zinc in the second undercoat is represented by y (% by weight), and the ratio, x, and the ratio, y, are values such as satisfy the following formulas:

$$1 \leq x \leq 20, \ 3 \leq y \leq 13, \ 3 \leq (x+y)/2 \leq 13$$

and wherein the flux includes rosin flux, and the content of halogen in the flux is 0.06% by weight or less, and wherein the composition of the mixture of the first undercoat and the second undercoat comes to or is closer to the tin-zinc eutectic composition than each composition of the first undercoat and the second undercoat.

25. The joining method of claim 24, wherein the first undercoat and the second undercoat are composed of an alloy of tin and zinc.

* * * * *